(12) United States Patent
Hand et al.

(10) Patent No.: US 6,625,183 B1
(45) Date of Patent: Sep. 23, 2003

(54) EXTERNAL CAVITY LASER APPARATUS

(75) Inventors: Carter F. Hand, San Francisco, CA (US); Bruce Jenket, Union City, CA (US); Jan-Willem Pieterse, San Jose, CA (US); Mark Wippich, Campbell, CA (US); Khiem Do, San Jose, CA (US)

(73) Assignee: New Focus, Inc., San Jose, CA (US)

( * ) Notice: Subject to any disclaimer, the term of this patent is extended or adjusted under 35 U.S.C. 154(b) by 0 days.

(21) Appl. No.: 09/494,615

(22) Filed: Jan. 31, 2000

(51) Int. Cl.[7] .................................................. H01S 3/10
(52) U.S. Cl. ........................ 372/20; 372/9; 372/98; 372/92; 372/107
(58) Field of Search ............................ 372/92, 98, 20, 372/9, 99, 107

(56) References Cited

U.S. PATENT DOCUMENTS

| 4,847,854 A | * | 7/1989 | Van Dijk ...................... 372/92 |
| 5,144,638 A | * | 9/1992 | Davin ........................ 372/107 |
| 5,319,668 A |   | 6/1994 | Lueke ........................ 372/107 |
| 5,347,527 A | * | 9/1994 | Favre et al. ................... 372/20 |
| 5,379,310 A |   | 1/1995 | Papen et al. .................... 372/23 |
| 5,594,744 A |   | 1/1997 | Lefevre et al. ................ 372/20 |
| 5,802,085 A | * | 9/1998 | Lefevre et al. ................ 372/20 |
| 5,867,512 A |   | 2/1999 | Sacher .......................... 372/20 |
| 6,031,852 A | * | 2/2000 | Thompson et al. ........... 372/20 |
| 6,047,008 A | * | 4/2000 | Funakawa ..................... 372/20 |
| 6,154,471 A | * | 11/2000 | Jin et al. ....................... 372/20 |
| 2002/0024979 A1 | * | 2/2002 | Vilhelmsson et al. ......... 372/20 |

* cited by examiner

Primary Examiner—Leon Scott, Jr.
(74) Attorney, Agent, or Firm—Alan W. Cannon

(57) ABSTRACT

Apparatus and methods that provide a tunable laser output wavelength which varies linearly or with high predictability over time, and which can provide tuning speeds of greater than 100 nanometers per second. The apparatus includes a laser resonator cavity having first and second reflective elements, at least one of which is movable to provide a constant change in output wavelength with respect to time. A tuning assembly associated with the movable reflective element is structured, configured, and positioned to adjust the movable reflective elements such that constant changes in output wavelength and high tuning speeds are provided.

13 Claims, 10 Drawing Sheets

EXTERNAL CAVITY LASER APPARATUS

BACKGROUND OF THE INVENTION

1. Field of the Invention

The present invention pertains generally to tunable laser devices and methods, and more particularly to an external cavity laser apparatus which provides high tuning speeds and highly predictable, constant change in laser output wavelength with respect to time.

2. Description of the Background Art

Optical communication and optical data storage technologies increasingly rely on use of tunable semiconductor lasers. The output of semiconductor lasers can be often tuned over a range of output wavelengths by adjusting the angular configuration of an external laser cavity. Typical external laser cavity arrangements utilize a retroreflective dispersive device, such as a diffraction grating, together with a movable end mirror which can be adjusted in angular position. Common external laser cavity configurations include the "Littrow" arrangement, in which the retroreflective dispersive element itself serves as a resonator end minor, and the "Littman-Metcalf" arrangement, wherein the retroreflective dispersive element is positioned between the end mirrors of a "folded" resonator cavity. The end mirror and/or retroreflective dispersive element are varied in angle with respect to each other to control tuning or selection of desired laser output wavelengths.

The evolving uses for tunable solid state lasers has increasingly required precise systems and methods for optical frequency or wavelength control. In the field of photonics, and particularly in the filed of passive optical components, the optical characteristics of components must be tested for manufacturing, quality control and other purposes. These characteristics typically vary with the wavelength of the light input to the component, and tunable solid state lasers have been used for evaluating such optical characteristics throughout the wavelength ranges of the components.

An important deficiency of presently available tunable solid state lasers is the lack of smooth, constant, accurate tuning action to provide highly predictable tuning speeds and output wavelengths during tuning. Even relatively small amounts of wear or machining error in parts and/or low levels of vibration make accurate tuning difficult to achieve. The tuning inaccuracies of currently available solid state lasers increases the time and expense required for characterization of optical components, and can result in reduced component quality.

Various tuning mechanisms for external cavity diode lasers have been designed and implemented to improve tuning accuracy through control of external laser cavity configuration. Currently available tuning mechanisms, however, have not provided the needed increases in tuning accuracy. These tuning mechanisms also tend to be relatively complex and are subject to increased wear and require a high level of maintenance. Tuning mechanisms which have achieved some smoothness in tuning have done so at the expense of undesirable reductions in tuning speeds.

Corrective measures have also been implemented to overcome the low tuning accuracy of currently available solid state lasers. One such approach has been use of a high-precision wavelength meter control system together with the tunable laser. The wavelength meter typically comprises a high-finesse interferometer and a reference optical wavelength provided by an atomic or molecular emission or absorption feature. The tunable laser is stepped through a series of measurements, with the laser output wavelength being set or calibrated using the wavelength meter as a provider of feedback. This allows adjustment of the output wavelength of the tunable laser in precise amounts or increments to provide equally spaced, accurate measurement of the optical properties of components under test. Corrective measures of this type, however, are time intensive and result in considerable increase in the testing costs for optical components.

There is accordingly a need for an external cavity laser apparatus and method which provides highly accurate and predictable tuning speeds for tunable solid state lasers, which provides for rapid tuning, which provides output at precisely known wavelengths, which is of simple, wear-resistant construction, and which allows for quick and accurate wavelength-dependent characterization of optical components. The present invention satisfies these needs, as well as others, and generally overcomes the deficiencies found in the background art.

An object of the invention is to provide an external cavity laser apparatus and method which allows highly linear or highly predictable change in output wavelength.

Another object of the invention is to provide an external cavity laser apparatus and method which allows fast tuning speeds.

Another object of the invention is to provide an external cavity laser apparatus and method which operates with low tuning noise.

Another object of the invention is to provide an external cavity laser apparatus and method having a simple tuning mechanism which is easy to manufacture and implement.

Another object of the invention is to provide an external cavity laser apparatus and method having tuning mechanism which provides low friction, low wear and low-hysterysis tuning movement.

Another object of the invention is to provide an external cavity laser apparatus and method which delivers highly predictable output wavelengths without requiring complex corrective measures or control systems.

Another object of the invention is to provide a constant tuning speed micropositioning apparatus and method which allows quick and precise characterization of wavelength dependent properties of optical components.

Further objects and advantages of the invention will be brought out in the following portions of the specification, wherein the detailed description is for the purpose of fully disclosing the preferred embodiment of the invention without placing limitations thereon.

SUMMARY OF THE INVENTION

The present invention is a high precision, high tuning speed external cavity laser apparatus and method for tunable solid state lasers and the like. The invention provides for fast, highly predictable tuning of laser output wavelength or frequency and allows quick and easy wavelength- or frequency- specific characterization of optical components.

In its most general terms, the invention comprises an external cavity laser apparatus and method for use that provides an output wavelength which varies linearly and/or with high predictability over time, and which can provide tuning speeds of greater than 100 nanometers per second. More specifically, the invention comprises a laser resonator cavity having first and second reflective elements, at least one of which is movable to provide a constant or highly predictable change in output wavelength with respect to time. A tuning assembly associated with the movable reflective element is structured, configured and positioned to positionally adjust the movable reflective element such that constant changes in output wavelength and high tuning speeds are provided.

In a first presently preferred embodiment of the invention, the tuning assembly comprises a cam body, a motor or like rotating drive source which rotatably drives the cam body, an actuator arm which is mechanically interfaced with the cam body, and a low friction cam interaction surface associated with the mechanical interface of the cam body and the actuator arm. The actuator arm is coupled to the movable reflective element of the resonator cavity, and rotational movement of the cam body is transferred to the movable reflective element via the actuator arm such that the movable reflective element undergoes positional adjustment responsive to movement of the cam body. The output wavelength can be tuned with high linearity and/or predictability with respect to the rotational speed of the drive motor.

By way of example, and not of limitation, the actuator arm preferably is pivotally mounted to a base or surface at a pivot point such that the optical element undergoes positional adjustment which is pivotal in nature with respect to the pivot point. A cam follower pad is positioned on the actuator arm and interacts directly with the cam body. The cam follower pad preferably comprises a low friction material or includes a low friction surface. The cam body likewise has a low friction surface. The low friction surfaces provide smooth, vibration-free mechanical interaction between the cam body and cam follower pad. The rotational drive source is preferably a low vibration brushless DC motor. The structure and configuration of the cam body can be varied to provide a particular type, speed and range of movement to the positionally adjustable reflective element.

The invention is particularly well suited for use with external cavity solid state lasers. In this regard, the second resonator end reflective element will generally comprise the reflective rear facet of a solid state laser, which is fixed in position with respect to the movable reflective element. A retroreflective dispersive element such as a diffraction grating is fixedly positioned between the solid state laser and the movable reflective element. The cam body is structured and configured to provide a constant, linear tuning speed to the external cavity laser in terms of wavelength per second. The radius of the cam body changes according to its eccentricity to provide a change in feedback angle in the actuator arm and attached movable reflective element, and hence provides a change in output wavelength.

In operation, the action of the drive motor causes the cam body to rotate. As the cam body rotates, the cam body is in contact with the actuator arm, and the eccentricity of the cam body results in movement of the actuator arm and attached resonator end reflective element about the pivot point of the actuator arm. The pivotal movement provides both rotational and translational motion to the resonator end reflective element and results in change in length of the resonator cavity and tuning of the laser output wavelength or frequency. The shape of the cam body can be tailored to provide a particular desired rate in change in output wavelength with respect to motor rotational position $\omega$. Particularly, the cam body may be structured and configured such that $d\omega/dt = d\lambda/dt = $ a constant value.

The high predictability of the laser output wavelength with respect to time as provided by the invention reduces the level of electronic feedback necessary for control of the output wavelength. Preferably, an optical encoder is associated with the brushless DC motor. The encoder is interfaced with a servo control system, and a linear amplifier is used to control the motor according to feedback from the encoder. The use of a linear amplifier, rather than a conventional pulse width modulated amplifier, provides for reduced noise while tuning the output wavelength.

In a second preferred embodiment of the invention, the tuning mechanism comprises a weighted pendulum and a pivoting actuator arm coupled thereto at one end of the actuator arm. The movable reflective element is coupled to the other end of the actuator arm. The pendulum is moved or pushed to provide an oscillating, pendular motion to the pendulum and actuator arm. As the pendulum actuator arm moves, the attached reflective element undergoes an oscillating movement which provides highly predictable tuning of the output from the laser.

In a third preferred embodiment of the invention, the tuning assembly comprises a pivoting actuator arm directly coupled to a low vibration rotational drive source. The movable reflective element is mounted on the actuator arm and undergoes positional adjustment as the actuator arm moves pivotally with respect to the drive source.

In a fourth preferred embodiment of the invention, the tuning assembly comprises a pivoting actuator arm associated with an arcuate voice coil. The voice coil includes an arcuate actuator magnet coupled to the actuator arm, and arcuate wire coils around the actuator magnet which are fixed externally with respect to the actuator arm and actuator magnet. Passage of current through the wire coils results in movement of the actuator magnet, actuator arm and attached reflective element. The angle of arc of the voice coil is structured and configured according to the length of the actuator arm and position of the pivot point of the actuator arm.

In a fifth preferred embodiment of the invention, the tuning assembly comprises a pivoting actuator arm with a first magnet coupled thereon, and a second magnet coupled to an external drive source. The first and second magnets are positioned proximate to each other to exert a mutually opposing magnetic force against each other such that movement of the second magnet by the external drive source results in movement of the first magnet together with the attached actuator arm and reflective element.

The use of the preferred tuning assembly embodiments as provided by the invention allows highly predictable laser tuning output and fast tuning speeds. The preferred tuning mechanisms are easy and inexpensive to manufacture and implement. The absence of screws, gears and like moving parts in tuning mechanisms of the invention provides for low friction, low wear and low-hysterysis movement for predictable, accurate, low noise tuning without use of a wavelength meter or other corrective measures or complex control systems. The high predictability and fast tuning speed of the laser output wavelength provided by the invention allows quick and precise characterization of wavelength dependent properties of optical components.

BRIEF DESCRIPTION OF THE DRAWINGS

The present invention will be more fully understood by reference to the following drawings, which are for illustrative purposes only.

DETAILED DESCRIPTION OF THE PREFERRED EMBODIMENTS

Referring more specifically to the drawings, for illustrative purposes the present invention is embodied in the apparatus and graphical representations shown generally in FIG. 1 through FIG. 12. It will be appreciated that the apparatus may vary as to configuration and as to details of the parts, and that the method of the invention may vary as to details and the order of the steps, without departing from the basic concepts as disclosed herein. The invention is disclosed generally in terms of use with an external cavity solid state laser and the tuning thereof by positional adjustment of an end resonator mirror, using an external laser cavity of the Littman-Metcalf type configuration. However, it will be readily apparent to those skilled in the art that the invention may be used with dye lasers or other non-solid state laser media, may be used in other external cavity configurations, and may be used generally for highly predictable micropositioning of a variety of different optical components for various applications.

The laser tuning provided by the invention is primarily disclosed in terms of wavelength ($\lambda$) rather than frequency ($\nu$). Wavelength and frequency, as is well known, are related by $c=\lambda\nu$, where c is equal to the speed of light. It should thus be readily understood that the invention may be used in terms of change in frequency with respect to time as well as change in wavelength with respect to time. (i.e., laser output may be tuned in terms of $d\nu/dt$ as well as $d\lambda/dt$). Many passive optical components are characterized in terms of frequency rather than wavelength, and it should be understood that the scanning of such components in accordance with the invention may be carried out or characterized in terms of frequency as well as wavelength. Thus, the term "wavelength" as used herein to described the output properties of the tunable lasers used with the invention is meant to include or encompass "frequency" as well.

Figure 1:
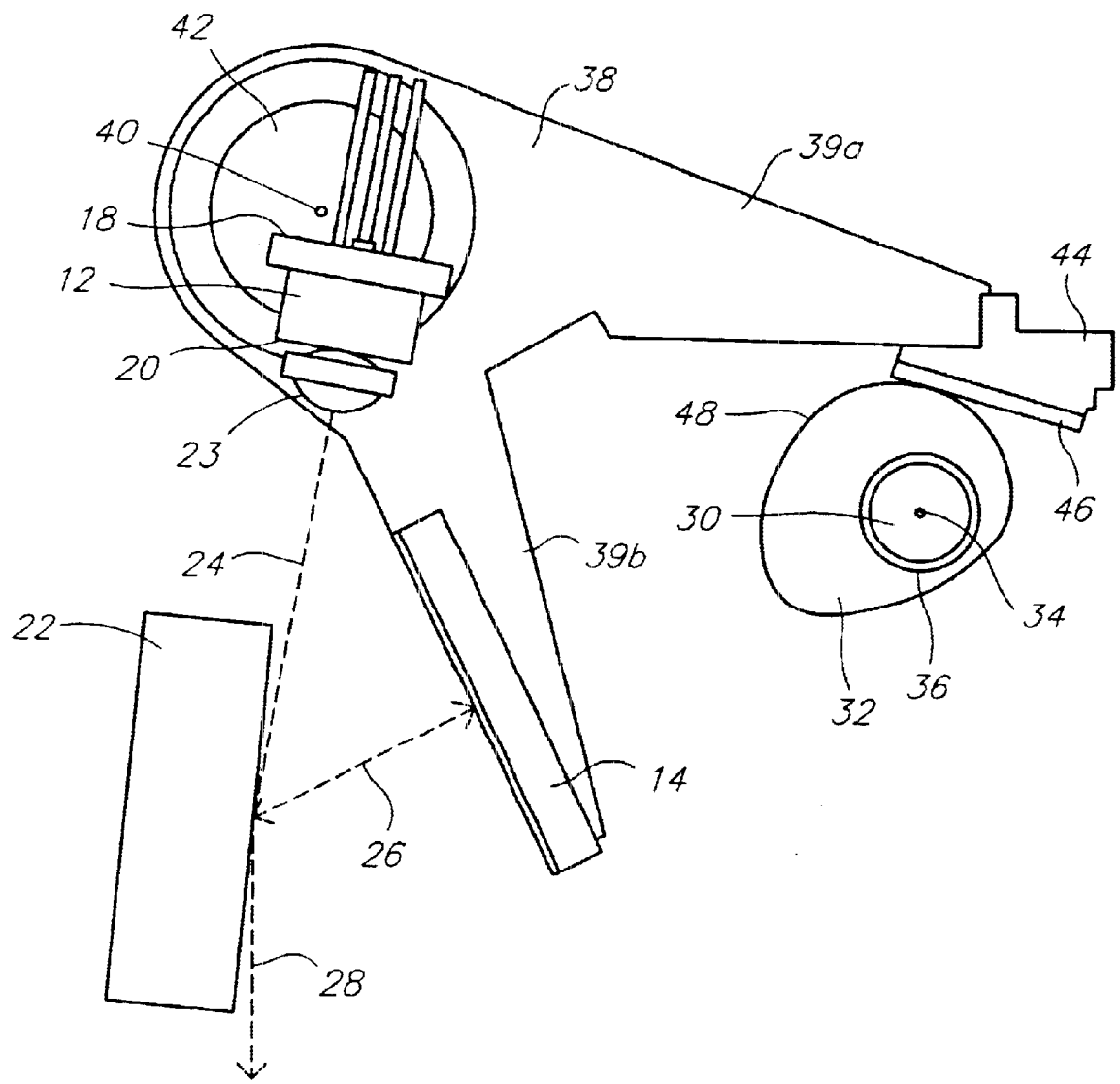
FIG. 1 is a schematic top plan view of a first embodiment of an external cavity laser apparatus in accordance with the present invention.

Referring now to FIG. 1, a first preferred embodiment of an external cavity laser apparatus 10 in accordance with the invention is generally shown. The apparatus 10 comprises generally a solid state or diode laser device 12, a movable reflective or retroreflective tuning element 14, and a tuning drive assembly 16 associated with movable reflective element 14. Solid state laser 12 may comprise a variety of conventional semiconductor laser devices, and will have generally a reflective rear facet 18, a front or emission facet 20, and a laser active region (not shown) positioned therebetween. Movable reflective element 14 preferably comprises a mirror or prism.

Solid state laser 12 is stationary with respect to movable reflective element 14. Movable reflective element 14 defines a first end of an external laser cavity. The reflective rear facet 18 of laser 12 defines a second end of the laser cavity. A retroreflective dispersive element such as a diffraction grating 22 is positioned within the laser cavity between laser 12 and movable reflective element 14. A collimating lens 23 collimates light output 24 from solid state laser 12. The collimated light 24 is directed towards diffraction grating 22 at an angle such that a first order diffraction 26 is directed towards movable reflective element 14. Reflective element 14 reflects or returns the first order diffracted light 26 to grating 22, which returns light through lens 23 to solid state laser 12 via a second diffraction. The external cavity laser apparatus 10 provides a laser output beam 28 as the zeroth-order diffraction from grating 22. As shown, diffraction grating 22 is positioned to define an external laser cavity of the Littman-Metcalf type configuration wherein the laser cavity is "folded".

Drive assembly 16 comprises a drive motor 30 and a cam body 32 coupled to motor 30 by a rotating drive shaft 34. Drive motor 30 is preferably a brushless DC motor, and is operatively coupled to an external DC power source (not shown). A rotational encoder 36 is included with drive motor 30 which counts rotations of drive shaft 34. Drive motor 30 preferably is fixedly mounted on a base or support (not shown).

Movable reflective element 14 is mounted on a pivoting actuator arm member or element 38. Actuator arm member 38 may comprise a variety of structures and configurations, and is shown in a presently preferred configuration wherein a first extension 39a is associated with cam body 32, and a second extension 39b is coupled to movable reflective element. Actuator arm member 38 is pivotally mounted on a base or support (not shown) at pivot point 40 via a pintle or pivot element 42 such that actuator arm member 38 moves pivotally about pintle element 42 and pivot point 40. A cam follower element 44 is coupled to arm 39a of arm member 38 and is positioned adjacent cam body 32 of drive assembly 16. Preferably, a cam follower pad 46 comprising a low wear, low friction coefficient material is included on cam follower element 44 adjacent the camming surface 48 on cam body 32. Actuator arm member 38 and cam follower element 44, together with drive assembly 16, provide a tuning mechanism for the apparatus 10.

In operation, drive motor 30 rotatably drives cam body 32, and the eccentric shape of cam body 32 results in the exertion of a force by camming surface 48 against cam follower pad 46 and cam follower element 44. The force thus exerted causes the attached actuator arm member 38 to pivot about pintle element 42, and results in movement of mirror 14. Actuator arm 38 is a single, integral mechanical entity, and the pivotal movement of extension 39a and cam follower 44, in response to rotation of cam body 32, introduces a corresponding movement to extension 39b and reflective element 14. The rotational motion of reflective element 14 serves to increase or decrease the angle of the reflected wave from diffraction grating 22 to effect tuning of the wavelength of output beam 28. Counterclockwise rotation of reflective element 14 and actuator arm 38 provides a longer output wavelength, while clockwise rotation produces a shorter output wavelength. The operational wavelength of output beam 28 is primarily determined by the angular relationship of movable reflective element 14 with respect to diffraction grating 22. The lineal or translational motion of reflective element 14 is used to maintain the optical pathlength of the external resonant cavity at a fixed, integral multiple of half-wavelengths of the output wavelength.

Figure 2:
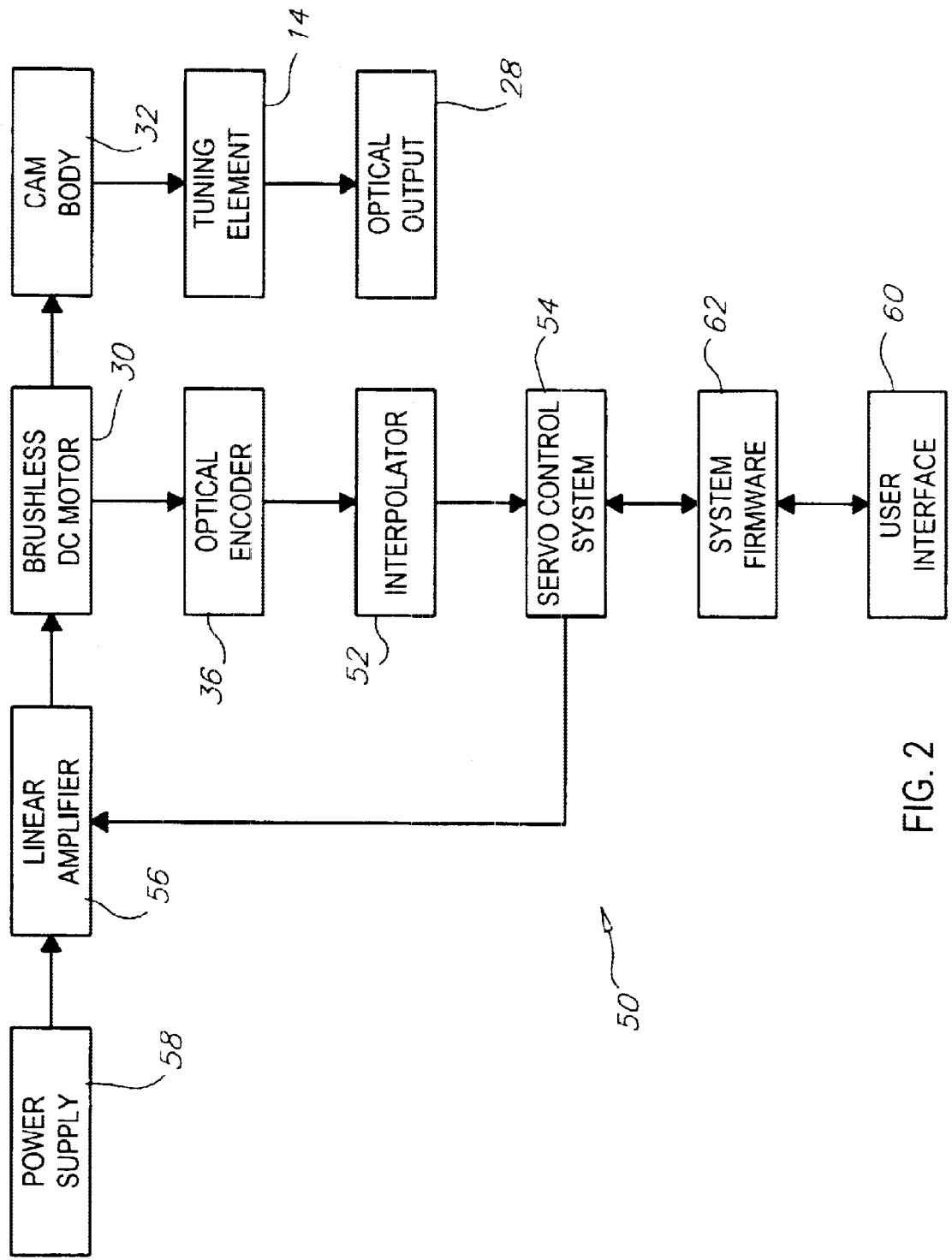
FIG. 2 is a functional block diagram of a tunable laser system using the external cavity laser apparatus of the invention.

Referring also to FIG. 2, the external cavity laser apparatus of the invention is preferably utilized with a laser tuning system 50, which is shown generally as a functional block diagram wherein like reference numbers denote like parts. The optical rotational encoder 36 on brushless DC motor 30 is operatively coupled through an interpolator 52 to a servo control system 54. Servo control system 54 is operatively coupled to a linear amplifier 56, which is powered by a linear amplifier power supply 58. Servo control system 54 is operatively coupled to user interface 60 through system firmware 62. Encoder 36 optically monitors rotation of motor 30 and provides feedback to servo control system 54 via interpolator 52. Servo control system 54 directs the operation of motor 30 via linear amplifier 56 according to the feedback from encoder 36. Motor 30 drives cam body 32 to move tuning element 14 to provide optical output 28 at a desired tuned wavelength. User interface 60 accesses servo control system 54 via system firmware 62. The use of a linear amplifier 56 with the invention is preferred over more commonly used pulse width modulation (PWM) amplifiers, as PWM amplification tends to result in a higher level of noise in optical output 28.

The structure and configuration of cam body 32 can be varied as desired to provide a desired tuning rate. The use of an eccentric cam body 32 to control movement of reflective tuning element 14 advantageously allows precise control of both rotational and translational movement of reflective element 14 during tuning. Generally, the change in wavelength with respect to rotational speed 0) of motor 30 and cam 32 for output 28 can be described by $$d\lambda/d\omega = C_o$$

where $\lambda$=wavelength, t=time, $\omega$=rotational speed of motor 30, and $C_o$=a constant determined according to the structure and configuration of cam body 32.

Cam 32 may alternatively be designed to provide tuning speeds and predictability which are characterized in frequency $\nu$ instead of wavelength $\lambda$. In this regard, cam 32 would be structured and configured to provide a constant tuning speed equal to $d\nu/d\omega$. It should be readily understood that a cam 32 which is configured to provide a constant $d\lambda/d\omega$ will differ slightly in shape from a cam 32 configured to provide a constant $d\lambda/d\omega$.

Figure 3:
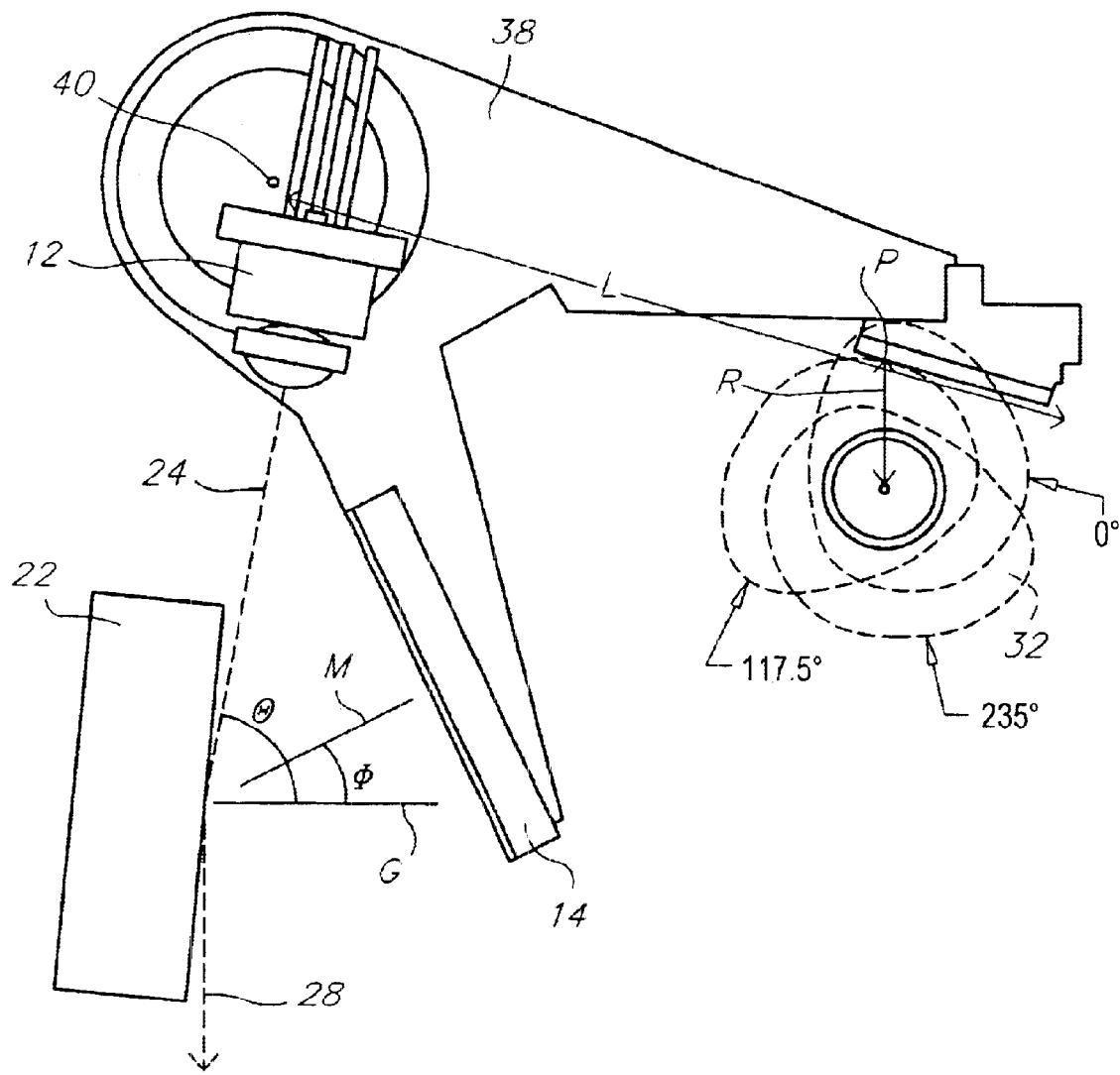
FIG. 3 is a schematic top plan view of the external laser cavity apparatus of FIG. 1 which illustrates the motion of the cam body and actuator arm during tuning.
Figure 4:
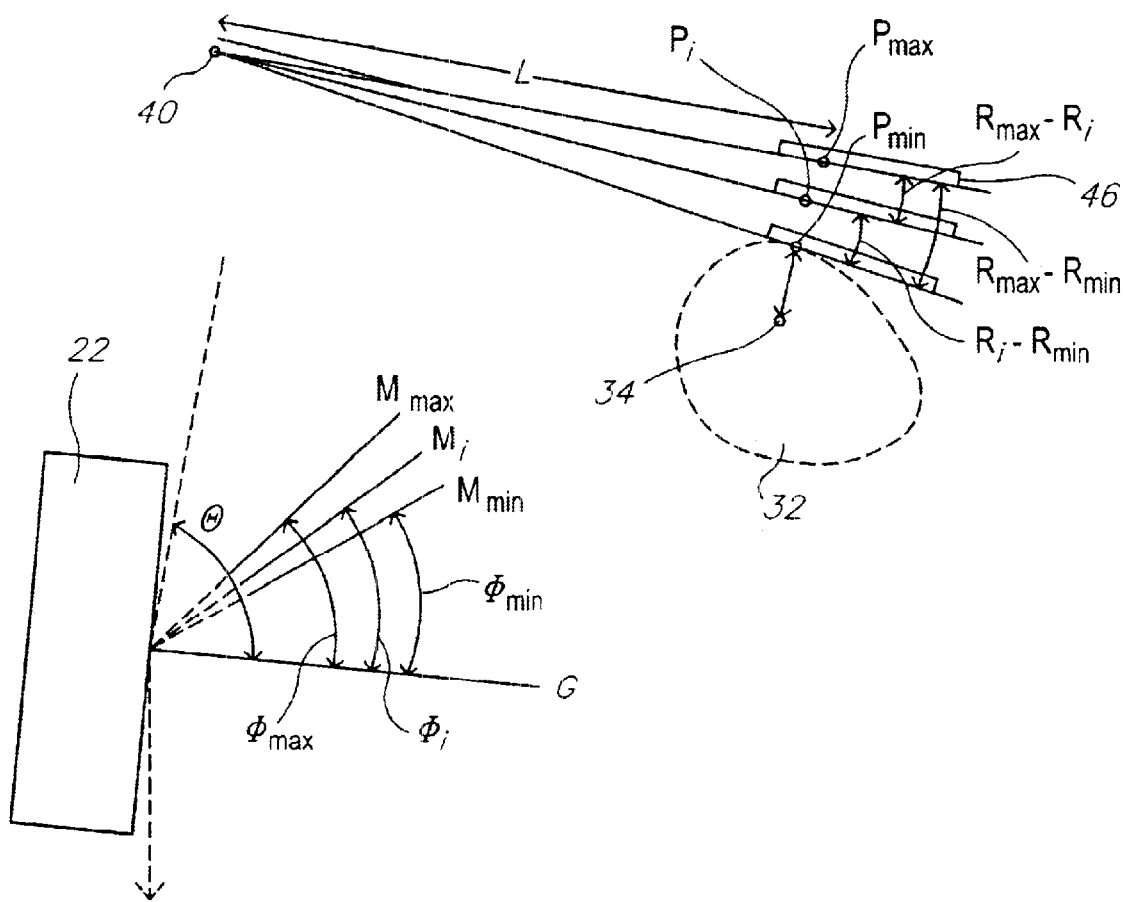
FIG. 4 is a schematic representation of selected angular and positional relationships associated with the tuning motion shown generally in FIG. 3

Referring more particularly to FIG. 3 and FIG. 4, the tuning of output wavelength 28 of the apparatus 10 with respect to the rotational movement of cam body 32 and angular position of mirror 14 is illustrated. In FIG. 3 and FIG. 4, the distance L represents the distance between pivot point 40 and the point-of contact P between cam surface 48 and cam follower pad 46. The radius of cam 32 is shown by R, which will vary according to the eccentricity of cam body 32 as cam body rotates. Line M is a line normal to the surface of mirror 14. Line G is a line normal to the surface of grating 22. Angle $\theta$ represents generally the angle between input beam 24 from laser 12 and line G normal to grating 22. Angle $\phi$ represents generally the angle between the line M normal to mirror 14 and the line G normal to grating 22.

With the above in mind, the output wavelength $\lambda_i$ for a particular angle $\phi_i$ can be shown by $$\sin\phi_i = \lambda_i g - \sin\theta$$

or $$\lambda_i = (\sin\phi_i + \sin\theta)/g,$$

where $\lambda_i$ is in microns, and g=the grating density of diffraction grating 22 in microns. For the ECDL apparatus 10, the angle $\theta$ is preferably maintained at approximately 85°, and grating density g is preferably one line per micron. The ECDL apparatus 10 provides tuning of output wavelength over a range extending from $\lambda_{min}$ (shortest output wavelength) to $\lambda_{max}$ (longest wavelength) with a range of angular movement of mirror 14 corresponding to minimum and maximum angles $\phi_{min}$ and $\phi_{max}$ respectively. For a particular angle $\phi_i$, the angular movement with respect to $\phi_{min}$ can be shown by $$\sin\phi_i - \sin\phi_{min} = [\lambda_i g - \sin\theta] - [\lambda_{min} g - \sin\theta m],$$

or, more conveniently, by $$\phi_i - \phi_{min} = \sin^{-1}[\lambda_i g - \sin\theta] - \sin^{-1}[\lambda_{min} g - \sin\theta].$$

Since cam follower 44, actuator arm member 38, and mirror 14 comprise a single mechanical entity as noted above, cam follower 44 undergoes a corresponding movement with respect to the angular movement of mirror 14. Thus, as mirror 14 undergoes angular motion, the point of contact P adjacent cam surface 48 undergoes a translation shown (to the first order) by $$\sin(\Delta\phi) \approx \Delta R/L,$$

where R is the radius of cam 32 at contact point P during tuning, and where L is the distance between pivot point 40 and contact point P as noted above. The tuning motion of apparatus 10 can thus be expressed in terms of cam radius R and distance L by $$(R_i - R_{min})/L = \sin(\phi_i - \phi_{min}) = \sin\{\sin^{-1}[\lambda_i g - \sin\theta] - \sin^{-1}[\lambda_{min} g - \sin\theta]\}.$$

where $R_{min}$ is the radius of cam 32 for the point of contact $P_{min}$ corresponding to angle $\phi_{min}$ and output wavelength $\lambda_{min}$, and $R_i$ is the radius of cam 32 for the point of contact $P_i$ corresponding to angle $\phi_i$ and output wavelength $\lambda_i$, as shown in FIG. 4.

In one specific example for ECDL apparatus 10, cam body 32 is structured and configured to mechanically provide a tuning range of between $\lambda_{min}$=1475 nm and $\lambda_{max}$=1585 nm. In FIG. 3, cam 32 is shown in three positions corresponding to cam rotational angles $\psi_{min}$=0° for $\lambda_{min}$=1475 nm, and $\psi_{max}$=235° for $\lambda_{max}$=1530 nm. An intermediate position for cam 32 is also shown at $\psi_i$=117.5° for $\lambda_i$=1530 nm. The positions shown in FIG. 4 shown for $M_{min}$, $M_i$, $M_{max}$, $\phi_{min}$, $\phi_i$, $\phi_{max}$, and $P_{min}$, $P_i$, $P_{max}$ correspond respectively to the $\psi_{min}$, $\psi_i$, $\psi_{max}$ of FIG. 3. The angular and positional relationships shown in FIG. 7 and FIG. 8 and described above may alternatively be characterized in terms of frequency, rather than wavelength, as previously related.

Table 1 shows output wavelength in increments of five nm for corresponding cam rotational angle ψ and angle φ.

TABLE 1

| Wavelength (nm) | Cam Angle ψ | Angle φ |
| --- | --- | --- |
| 1475 | 0 | 28.60740343 |
| 1480 | 10.68182 | 28.93422866 |
| 1485 | 21.36364 | 29.26208774 |
| 1490 | 32.04545 | 29.59100141 |
| 1495 | 42.72727 | 29.92099084 |
| 1500 | 53.40909 | 30.25207771 |
| 1505 | 64.09091 | 30.58428422 |
| 1510 | 74.77273 | 30.91763309 |
| 1515 | 85.45455 | 31.25214758 |
| 1520 | 96.13636 | 31.58785153 |
| 1525 | 106.8182 | 31.92476938 |
| 1530 | 117.5 | 32.26292616 |
| 1535 | 128.1818 | 32.60234755 |
| 1540 | 138.8636 | 32.9430599 |
| 1545 | 149.5455 | 33.28509024 |
| 1550 | 160.2273 | 33.62846631 |
| 1555 | 170.9091 | 33.97321661 |
| 1560 | 181.5909 | 34.31937041 |
| 1565 | 192.2727 | 34.66695777 |
| 1570 | 202.9545 | 35.01600962 |
| 1575 | 213.6364 | 35.36655774 |
| 1580 | 224.3182 | 35.71863484 |
| 1585 | 235 | 36.07227456 |

The angle θ is 85°, and the grating density g is 1 line per micron, for each wavelength shown in Table 1. The data shown in Table 1 may alternatively be shown in terms of frequency, rather than wavelength, as noted above.

Referring again to FIG. 1, the presently preferred drive motor 30 is a Maxon Model 118888 brushless DC motor. The Maxon motor provides both high reliability and low cogging torque. Cogging torque is introduced by the interaction of permanent magnets in the rotor with stator teeth. The net effect of this interaction is a "cogging" action which adds noise to the tuning action. Various other DC motors may be used with the invention, but the Maxon motor has so far provided the smallest amount of noise during tuning.

Figure 5:
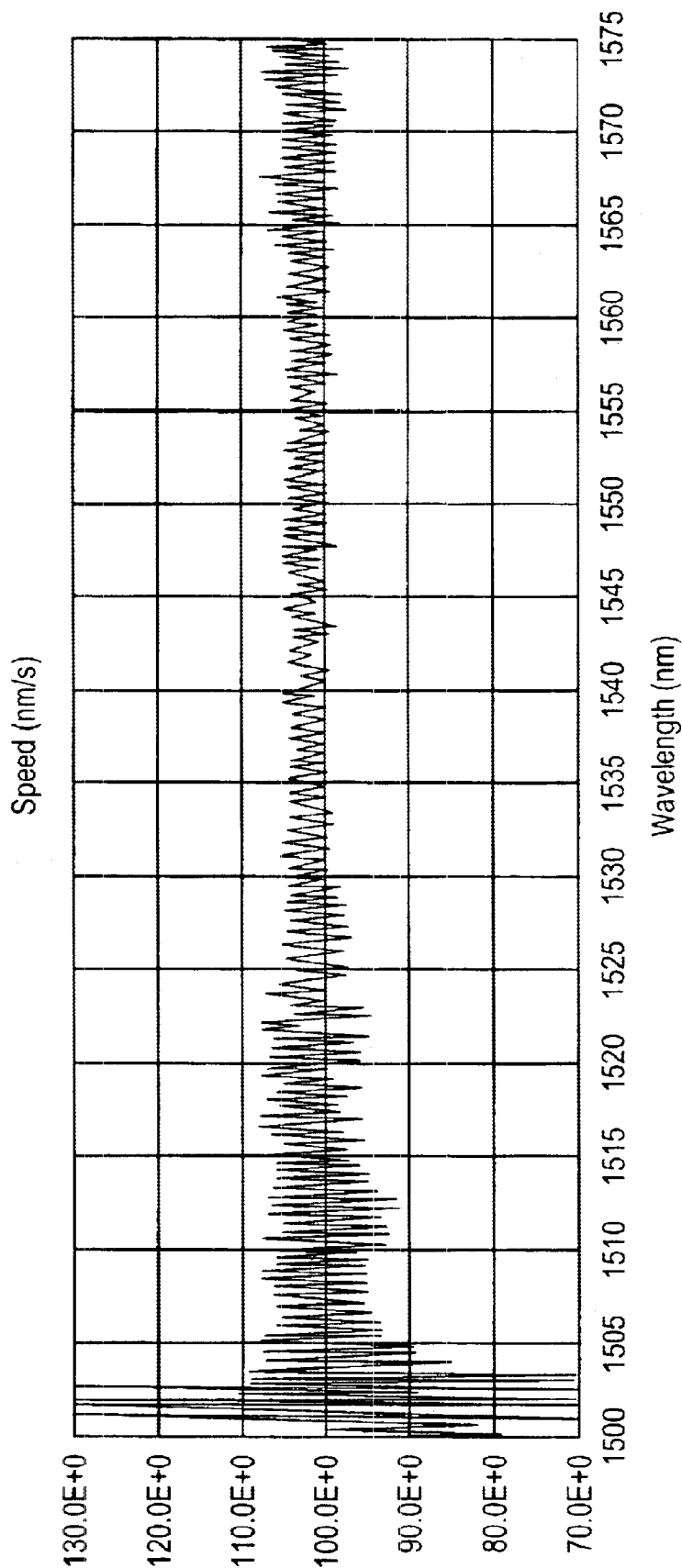
FIG. 5 is a graphical representation of tuning speed versus tuning wavelength for the external cavity laser apparatus of FIG. 1 and 3, wherein tuning speed in nanometers per second is shown along the vertical axis, and wavelength in nanometers is shown along the horizontal axis.

In FIG. 5 there is shown a graphical representation of tuning speed versus tuning wavelength for the external cavity laser apparatus 10 of FIG. 1 using the preferred Maxon brushless DC motor. Speed in nanometers per second is shown along the vertical axis, and wavelength in nanometers is shown along the horizontal axis. In the preferred embodiment, the Maxon motor provides a tuning rate of 110 nm/235°, or about 0.48 nm per degree of motor angle for the above specific example. Thus, operating the Maxon motor with cam 32 at a rotation rate of 250° per second yields a tuning rate of about 100 nm per second in this specific example. This rate corresponds to about 0.694 revolutions per second (RPS), or 41.6 rotations per minute (RPM), which results in very low noise levels during tuning.

Figure 6:
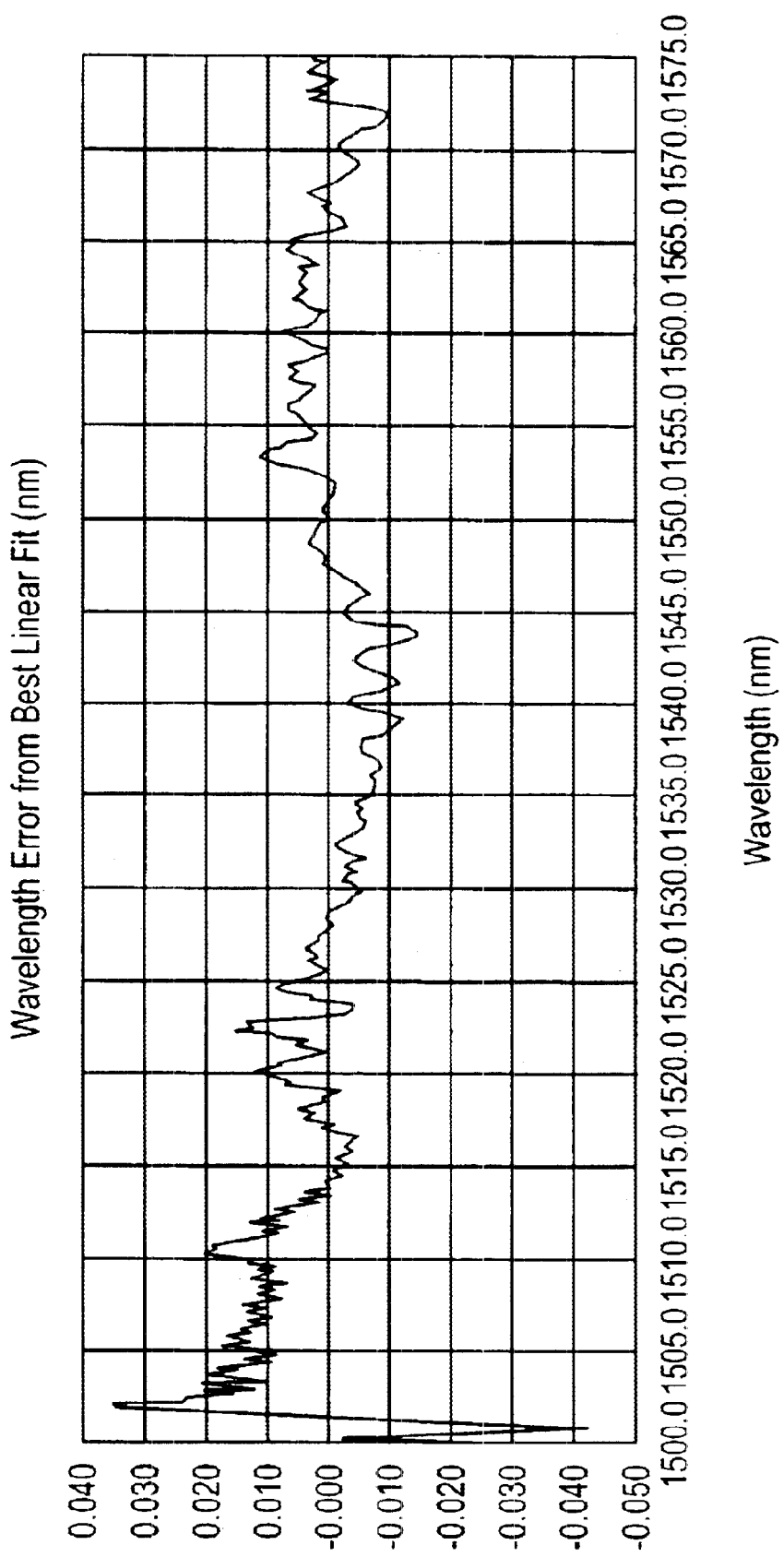
FIG. 6 is a graphical representation of wavelength error versus tuning wavelength for the external cavity laser apparatus of FIG. 1 and 3, wherein wavelength error from best linear fit is shown along the vertical axis, and wavelength in nanometers is shown along the horizontal axis.

In obtaining the data shown in FIG. 5 and FIG. 6, output from laser 12 of apparatus 10 was directed through an unequal length Michelson interferometer (not shown) with a FSR (Free Spectral Range) of about 6 pm (picometers). A Frequency Domain Analyzer or FDA (not shown) was used to count the number of fringes per second while motor 30 and cam 32 drove arm 38 and mirror 14, with sampling carried out every 250 microseconds. The FDA tuning rate was determined in fringes per second, which were then converted to nanometers per second. As can be seen in FIG. 5, the tuning speed over the entire 1500–1575 nm range remains generally greater than 100 nm/sec.

FIG. 6 is a graphical representation of wavelength error versus tuning wavelength for the external cavity laser apparatus 10 of FIG. 1 using the Maxon motor described above at a tuning rate of 100 nm/sec. Wavelength error from best linear fit is shown in nanometers along the vertical axis, and wavelength in nanometers is shown along the horizontal axis. In the 1512–1575 nm range, a relatively low wavelength error (from best linear fit) of ±0.01 is provided. The high predictability and high linearity of the laser output wavelength with respect to motor angle as shown in FIG. 6 reduces the level of electronic feedback necessary for control of the output wavelength. Thus, the invention does not require use of very fast electronic or mechanical corrections to achieve a linear tuning rate. This, in turn, allows for higher tuning speeds, as the invention is not mechanically bandwidth limited.

The preferred Maxon motor can operate at rotational speeds of as high as 17,000 RPM, which corresponds to a tuning rate of about 40,800 nm per second. While the invention provides tuning speeds of up to 40,800 nanometers per second, tuning speeds this high are achieved generally at the expense of increased tuning noise and decreased predictability or linearity of tuning. Particularly, the mechanical dynamics of various aspects of the drive train at very high tuning speeds results in mechanical resonances and other effects which diminish predictability and increase noise levels. Presently, effective tuning rates up to 10,000 nm per second have been achieved with relatively high linearity and low noise using the ECDL apparatus 10 with the Maxon motor as described above. Higher effective tuning rates with low noise and high predictability are expected to be achieved with the apparatus 10 as problems associated with mechanical resonances and other features are overcome.

The ECDL apparatus 10, using the Maxon motor, can also provide high predictability and low noise at very low tuning speeds of as low as 0.001 nm per second. Thus, the apparatus 10 effectively provides tuning speeds in the range of between about 0.001 nm per second, and about 40,000 nm per second. Preferably, the apparatus 10 is used to provide tuning rates of between about 0.001 nm per second and about 10,000 nm per second for the reasons noted above. More preferably, the apparatus 10 is used to provide tuning rates of between about 100 nm per second and about 2,000 nm per second. In the presently preferred embodiments, the apparatus 10 will have a tuning linearity such that a wavelength error of no greater than 0.1 nanometer from best linear fit is provided during scanning, and more preferably of no greater than 0.01 nanometer from best linear fit.

The above details and specific example, it should be kept in mind, merely provide a specific example of a tunable laser apparatus in accordance with the invention. Thus, the particular tuning ranges and tuning rates described above should not be considered as limiting. The particular structure and configuration of cam 32, actuator arm element 38, and/or the properties of grating 22 and type of drive motor 30, may be varied as desired for use with various types of tunable lasers to provide tuning over various wavelength ranges at a variety of tuning speeds. Semiconductor lasers suitable for use with the invention may be based on, for example, GaAs, AlGaAs, AlGaInP, InGaAs, AlGaInN, InGaAsN, InGaAsP, InP, GaN, or other materials, to allow tuning over various wavelength ranges. Presently, such semiconductor lasers can effectively provide outputs over the range of between about 300 nm to about 2300 nm, and this range will likely increase as new materials and semiconductor laser architectures are developed. The present invention may be used with any of these types of semiconductor lasers, as well semiconductor lasers developed in the future.

In order to achieve good tuning speed linearity with low noise, it is desirable to have a sufficiently high ratio of optical feedback to laser facet reflectivity. As the laser diode chip 12 itself will always have some feedback from its own front facet, there will always exist some competition between the external laser cavity and the internal cavity of diode laser 12. As tuning is carried out, the effect of the diode laser internal cavity feedback will be seen as an oscillating AC signal on top of the DC wavelength change. This effect can be seen in FIG. 5 as an increase in higher frequency noise below around 1520 nm as well as above 1570 nm. The increase in higher frequency noise is related to higher diode laser facet reflectivities.

The onset of instability of an ECDL (in terms of proper single-mode performance) occurs generally when $$R_{facet} \approx R_{external}/\alpha^2,$$

where $R_{facet}$ is the residual reflectivity of the diode laser front facet after antireflection (AR) coating, $R_{external}$ is the total external cavity reflectivity, and $\alpha$ is the laser linewidth broadening factor. This relationship is described in detail in "Axial Mode Instability in Tunable External-Cavity Semiconductor Lasers" by Zorabedian et al. (September, 1993), published by Hewlett-Packard Laboratories, 3500 Deer Creek Road, Palo Alto Calif. 94304, the disclosure of which is incorporated herein by reference.

In the present invention, the aforementioned high frequency noise is reduced when $$R_{facet} < R_{external}/2\alpha^2,$$

Such residual front facet reflectivity ($R_{facet}$) can be achieved through use of a variety of antireflection coating schemes, the designing of which is well known to those skilled in the art. As the need for lower noise tuning linearity increases in the future, the ratio of $R_{external}/R_{facet}$ will have to increase, either through improved antireflection coatings or higher levels of external cavity feedback.

The tribological relationship between cam surface 48 and cam follower pad 46 will affect noise level during tuning. In this regard, several materials for cam follower pad 46 were evaluated for low noise during tuning. Cam 32 is preferably fabricated from "416 SS" stainless steel, and cam interaction surface 48 is finely polished by conventional techniques. The materials considered for cam follower pad 46 included sapphire, "misaligned" (non-optimally aligned) sapphire, silicon nitride, commercial thermal spray coatings, and bronze-impregnated teflon. The coefficient of friction (COF) for these materials was evaluated over a sliding velocity range of between 0.1 mm/sec and 10 mm/sec, and are provided in Table 2.

TABLE 2

| Sliding Velocity, mm/sec | Frequency Hz | Sapphire | Sapphire, misaligned | Silicon Nitride | Thermal Spray Coating | Bronze-Teflon |
|---|---|---|---|---|---|---|
| 0.1 | 0.02 | 0.53 | 0.75 | 0.54 | 0.30 | 0.16 |
| 0.5 | 0.08 | 0.59 | 0.72 | 0.58 | 0.32 | 0.17 |

TABLE 2-continued

| Sliding Velocity, mm/sec | Frequency Hz | Sapphire | Sapphire, misaligned | Silicon Nitride | Thermal Spray Coating | Bronze-Teflon |
|---|---|---|---|---|---|---|
| 1 | 0.17 | 0.61 | 0.71 | 0.60 | 0.22 | 0.18 |
| 2 | 0.36 | 0.68 | 0.80 | 0.62 | 0.22 | 0.22 |
| 4 | 0.63 | 0.75 | 0.76 | 0.68 | 0.28 | 0.21 |
| 8 | 1.17 | 0.73 | 0.86 | 0.65 | 0.34 | 0.21 |
| 10 | 1.42 | 0.54 | 0.86 | 0.55 | 0.30 | 0.21 |

As can be seen in Table 2, the lowest COF over the entire velocity range was offered by the bronze-impregnated teflon, which was purchased from Coors Tetrafluor of Los Angeles, Calif. The COF of all materials tended to increase with increasing sliding velocity.

The noise properties associated with use of the same materials for cam follower pad 46 together with a "416 SS" cam body 32 with polished cam surface 48 were evaluated over the over a sliding velocity range of between 0.1 mm/sec and 10 mm/sec. The results are shown in Table 3.

TABLE 3

| Sliding Velocity, mm/sec | Frequency Hz | Sapphire | Sapphire, misaligned | Silicon Nitride | Thermal Spray Coating | Bronze-Teflon |
|---|---|---|---|---|---|---|
| 0.1 | 0.02 | no noise | no noise | no noise | no noise | no noise |
| 0.5 | 0.08 | no noise | no noise | no noise | no noise | no noise |
| 1 | 0.17 | no noise | no noise | no noise | no noise | no noise |
| 2 | 0.36 | no noise | incr noise | no noise | no noise | no noise |
| 4 | 0.63 | incr noise | incr noise | incr noise | incr noise | no noise |
| 8 | 1.17 | incr noise | incr noise | incr noise | incr noise | no noise |
| 10 | 1.42 | incr noise | incr noise | no noise | no noise | no noise |

All materials exhibitedted generally no noise at sliding velocities between 0.1 and 2 mm/sec. The sapphire, "misaligned" sapphire, silicon nitride and thermal spray coating tended to show increasing (incr) noise at sliding velocities above 4 mm/sec. Only the bronze-impregnated teflon resulted in no noise at higher sliding velocities.

The variation of Coefficient of Friction (COF) over time was evaluated for a bronze-impregnated teflon cam follower pad 46 and "416 SS" cam body 32 with polished cam surface 44. Table 4 shows the changes in COF over 48 hours.

TABLE 4

| Time (hours) | COF |
|---|---|
| 0 | 0.18 |
| 4 | 0.21 |
| 8 | 0.23 |
| 12 | 0.23 |
| 16 | 0.24 |
| 20 | 0.24 |
| 24 | 0.25 |
| 28 | 0.24 |
| 32 | 0.25 |
| 36 | 0.25 |
| 40 | 0.25 |
| 44 | 0.24 |
| 48 | 0.26 |

As can be seen in Table 4, the COF increased from an initial value of 0.18 to about 0.25 after 24 hours, and remained at about 0.25 thereafter. With the above in mind, the presently preferred material for cam follower pad 46, or an outer surface thereof, is bronze-impregnated teflon such as is available from Coors Tetrafluor, Inc. Another material considered for cam follower pad 46 is zirconia ($ZrO_2$), but is presently less preferred due to its cost. Various other low-wear, low-COF materials may be used for cam follower pad 46, as will be readily understood by those skilled in the art. It is also contemplated that various types of coatings or surface treatments can be used on cam surface 48 to avoid or reduce cam wear, including, for example, phosphate coatings or diffusion treatments, carburizing, nitriding, tuffriding, and ion implantation treatment.

Figure 7:
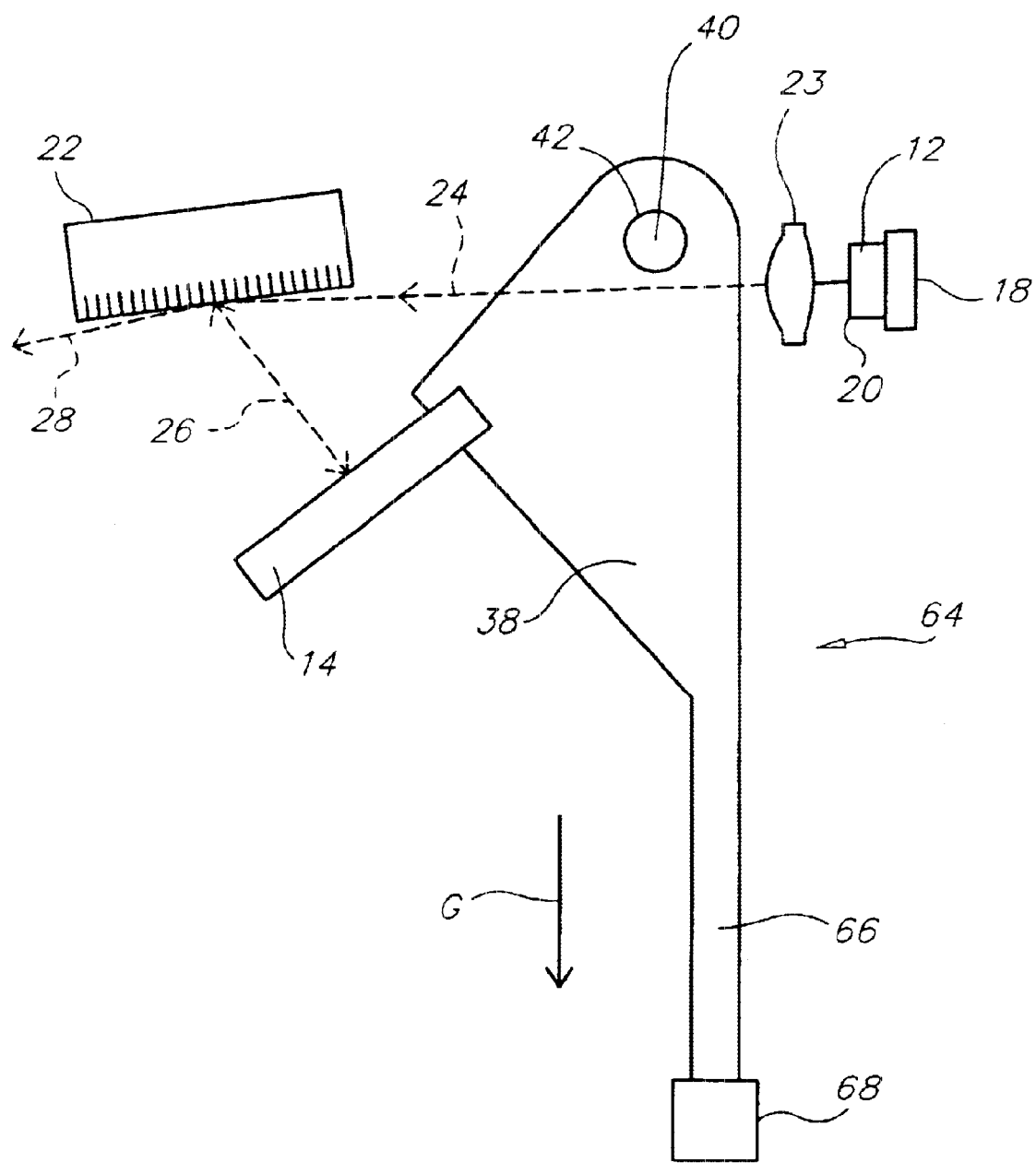
FIG. 7 is a schematic top plan view of a second embodiment of an external cavity laser apparatus in accordance with the present invention.

Referring now to FIG. 7, there is shown a second embodiment external cavity laser apparatus 64 in accordance with the invention, wherein like reference numbers are used to denote like parts. As in the apparatus 10 described above, the apparatus 64 comprises a diode laser 12 with a reflective rear face 18 and front emission facet 20. An actuator arm 38 is movably mounted to a base (not shown via a pintle element 42 about pivot point 40. A movable mirror or reflective element 14 is coupled to actuator arm 38. A collimating lens 23 and a stationary diffraction element 22 are positioned in the optical path between laser 12 and movable mirror 14.

Movable mirror 14 and reflective rear facet 18 of laser 12 define a folded laser cavity, with diffraction grating 22 and collimating lens 23 positioned within the laser cavity. Collimated light 24 is directed towards diffraction grating 22 such that a first order diffraction 26 is directed towards movable reflective element 14, and a laser output beam 28 is provided as the zeroth-order diffraction from grating 22, as noted above. Pivotal movement of actuator arm 38 creates a corresponding movement in reflective element 14, and the rotational motion of reflective element 14 serves to increase or decrease the angle of the reflected wave from diffraction grating 22 to effect tuning of the wavelength of output beam 28.

Drive means for actuator arm 38 are provided in the form of a gravity-actuated pendulum assembly comprising a pendulum extension 66 coupled to actuator arm, and a pendulum weight 68 coupled to the end of extension 66, with gravitational force G being used to drive the assembly. In operation, an initial force is laterally applied to weight 68 and extension 66 in order to overcome gravity G and impart an oscillating pivotal motion to actuator arm 38 and mirror 14. The oscillating motion of weight 68, extension 66, actuator arm 38 and mirror 14 will continue with a decreasing amplitude of oscillation, according to air drag on the assembly and friction associated with pintle 42, until the assembly comes to rest.

The external cavity laser apparatus 64 provides a very highly predictable change in the wavelength of laser output 28 during the oscillating motion of mirror 14 in the manner described above. The rate of change in output wavelength is quadratic, rather than linear, due to the use of a gravity driven pendulum for tuning. Various parameters, such as the length of extension 66, size of weight 68, and the initial force applied to weight 68 and extension 66, can be used to change the particular tuning characteristics of the apparatus 64.

Figure 8:
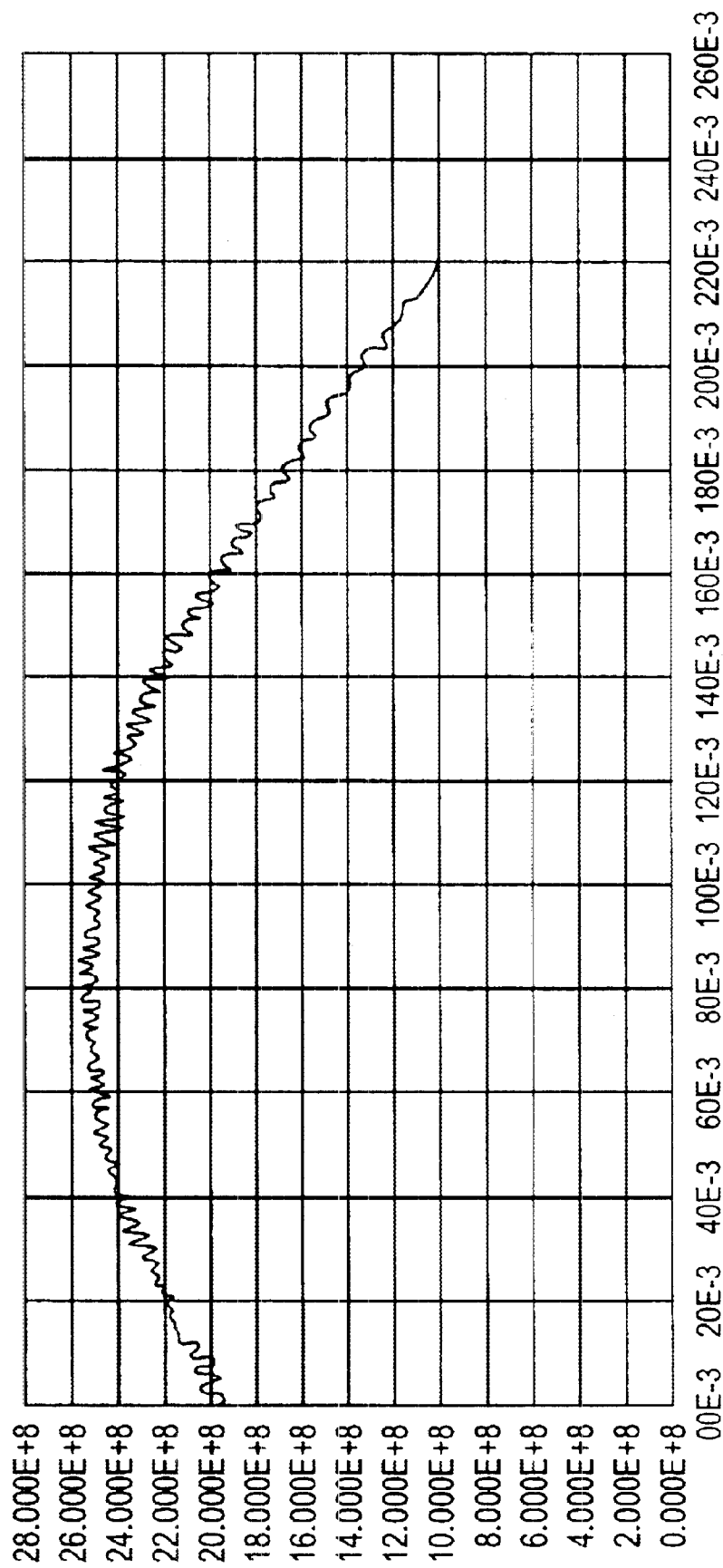
FIG. 8 is a graphical representation of tuning frequency versus time for the external cavity laser apparatus of FIG. 7.

FIG. 8 graphically illustrates the change in tuning speed versus time for the apparatus 64 of FIG. 7. Output from laser 12 of apparatus 64 was directed through an unequal length Michelson interferometer (not shown) with a very small FSR (Free Spectral Range) of about 5 fm (femtometers). A Frequency Domain Analyzer or FDA (not shown) was used to count the number of fringes per second while extension 66, weight 68 and mirror underwent pendular, oscillatory motion, with sampling carried out every 250 microseconds. Thus, the FDA plots the tuning rate for apparatus 64 in terms of fringes per second. FIG. 8 shows the frequency of fringes per time in Hz along the vertical axis, with time (seconds) shown along the horizontal axis. At a tuning rate of 100 nm per second with a 5 fm FSR, a tuning rate of 100 nm per second corresponds to about 20 MHz. As can be seen in FIG. 8, a tuning rate of greater than 100 nm per second is achieved over a substantial portion of the oscillating motion of apparatus 64. The peak of the frequency/time curve of FIG. 8 corresponds approximately to a wavelength of 1550 nm in this embodiment.

Figure 9:
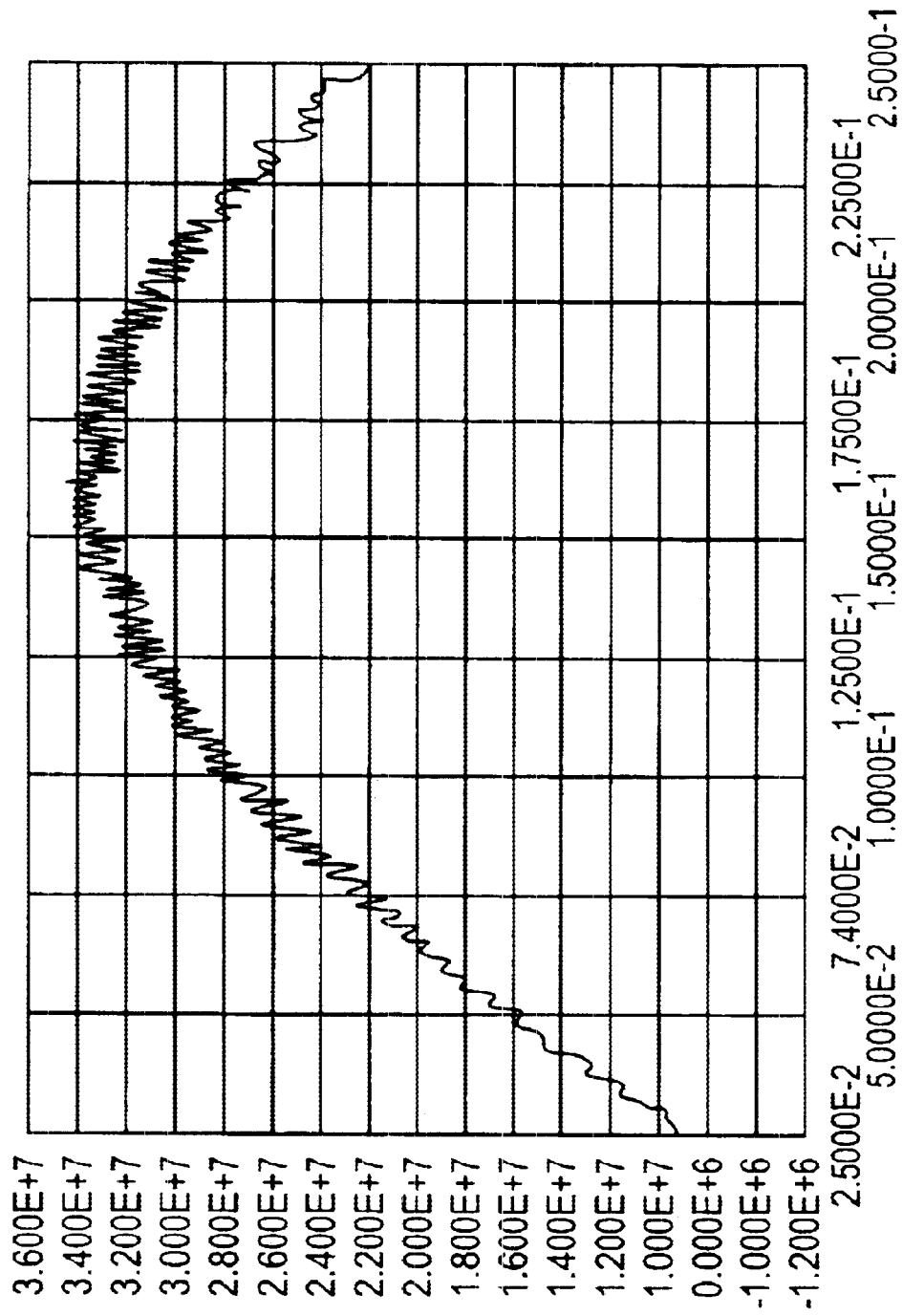
FIG. 9 is another graphical representation of tuning frequency versus time for the external cavity laser apparatus of FIG. 7.

Referring now to FIG. 9, another graphical illustration of tuning speed versus time is shown for the apparatus 64. As in FIG. 8, frequency of fringes per time in Hz is shown along the vertical axis, with time in seconds shown along the horizontal axis. In FIG. 9, the peak tuning speed of 34 MHz corresponds to about 170 nm/second tuning speed. Since gravity is the driving force in the tuning mechanism of the pendulum apparatus 64, tuning is achieved with essentially no noise, and with extremely high predictability.

Figure 10:
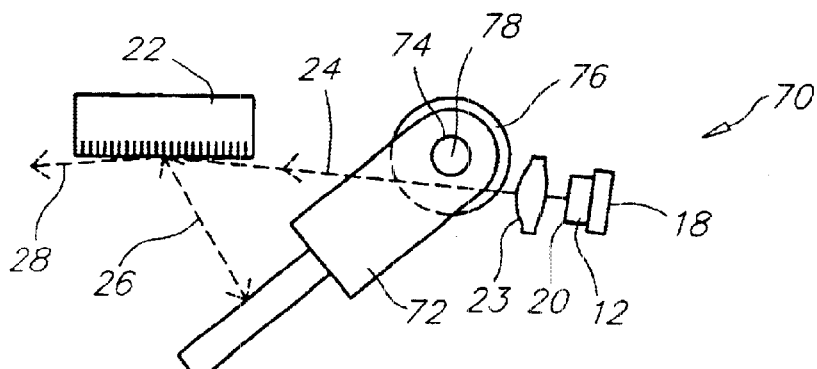
FIG. 10 is a schematic top plan view of a third embodiment of a constant tuning speed external cavity laser apparatus in accordance with the present invention.

Referring now to FIG. 10, there is shown a third embodiment external cavity laser apparatus 70 in accordance with the invention, wherein like reference numbers are used to denote like parts. In the apparatus 70, a somewhat shorter actuator arm 72 is coupled directly to the drive shaft 74 of a brushless motor 76, with the pivot point 78 for actuator arm located generally at the center of drive shaft 74. A movable mirror 14 is coupled to the end of actuator arm 72. Movable mirror 14 and reflective rear facet 18 of laser 12 define a folded laser cavity in the manner described above, with diffraction grating 22 and collimating lens 23 positioned within the laser cavity. Collimated light 24 is diffracted off grating 22 such that a first order diffraction 26 is directed towards movable reflective element 14, and the zeroth-order diffraction from grating 22 provides a laser output beam 28, as related above. Pivotal movement of actuator arm 38 creates a corresponding movement in reflective element 14, and the rotational motion of reflective element 14 serves to increase or decrease the angle of the reflected wave from diffraction grating 22 to effect tuning of the wavelength of output beam 28.

In operation, the laser cavity of apparatus 70 is tuned by simple rotation of drive shaft 74, which rotatably moves actuator arm 72 about pivot point 78 and correspondingly moves mirror 14 with respect to grating 22. Since mirror 14 is mechanically interfaced to drive shaft 74 directly through actuator arm 72, very high tuning speeds can be achieved with the apparatus 70. The direct coupling of actuator arm 72 to drive motor generally results in a higher noise level than in other embodiments of the invention due to motor vibration.

Figure 11:
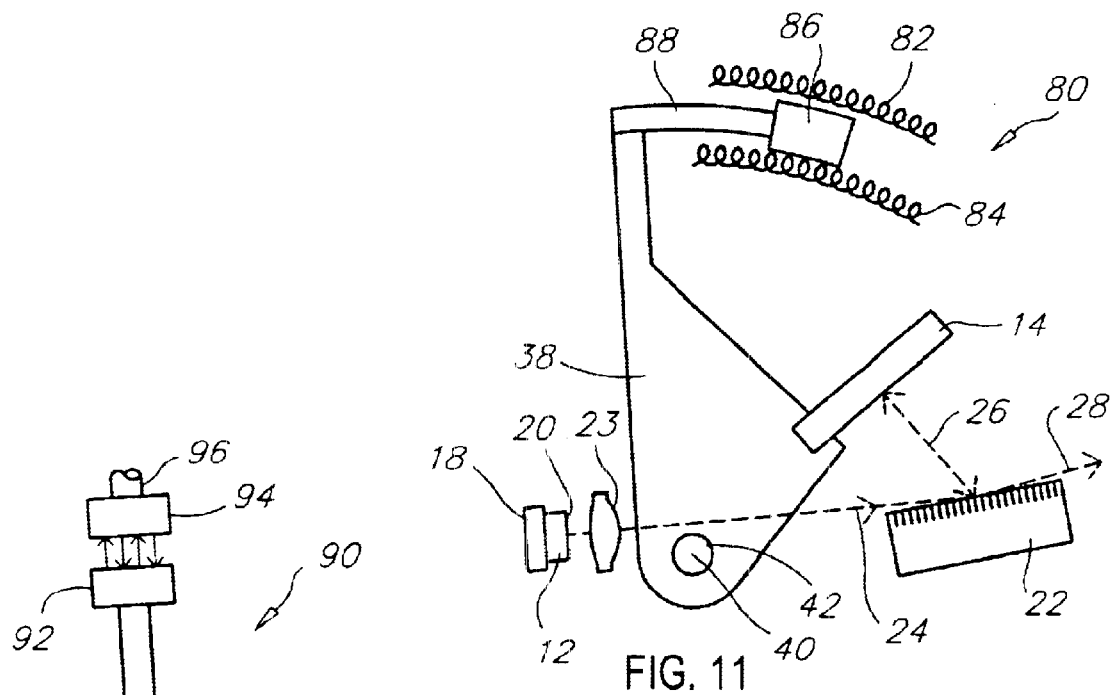
FIG. 11 is a schematic top plan view of a fourth embodiment of a constant tuning speed external cavity laser apparatus in accordance with the present invention.

Referring next to FIG. 11, there is shown a fourth embodiment external cavity laser apparatus 80 in accordance with the invention, wherein like reference numbers are used to denote like parts. The apparatus 80 utilizes a drive assembly based on a "voice coil" arrangement comprising two or more helical conductors 82, 84 and a magnet 86 positioned therebetween. Magnet 86 is coupled to actuator arm 38 by a support 88. Helical conductors 82, 84, magnet 86 and support 88 are preferably arcuate in shape in accordance with the pivotal nature of movement of actuator arm 38 about pivot point 40.

For tuning operation, an electric current is introduced to coils 82, 84, which generate a magnetic field proportional to the electric current. The mutually opposing magnetic fields associated with coils 82, 84 and magnet 86 result in movement of magnet 86 in a manner similar to that provided in a conventional voice coil in an audio speaker. The motion of magnet 86 provide a drive force to move actuator arm 38, and hence moves mirror 14 with respect to grating 22, to tune the wavelength of output 28, as described above. There is no physical contact between magnet 86 and coils 82, 84, so the tuning motion is generally noise-free.

Figure 12:
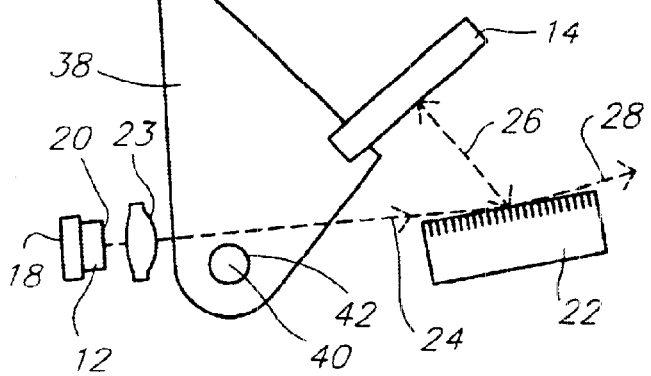
FIG. 12 is a schematic top plan view of a fifth embodiment of a constant tuning speed external cavity laser apparatus in accordance with the present invention.

Referring to FIG. 12, there is shown a fifth embodiment external cavity laser apparatus 90 in accordance with the invention, wherein like reference numbers are used to denote like parts. The apparatus 80 utilizes a drive assembly comprising a first magnet 92 coupled to actuator arm 38, and a second, non-contacting magnet 94 coupled to a drive arm 96. Drive arm 96 is coupled to a drive source (not shown) which moves drive arm 96 and magnet 94. Magnets 92, 94 exert mutually opposing forces against each other such that motion of magnet 94 via drive arm 96 will result in motion of magnet 92, which in turn pivots actuator arm 38 to move mirror 14 with respect to grating 22 and effect tuning of output 28. Magnets 92, 94 are non-contacting during drive motion, so the tuning motion provided to mirror 14 is basically noise free. Various other arrangements of magnets 92, 94, as well as additional magnets (not shown) may be used such that mutually opposing magnetic forces can be used to move mirror 14 for tuning of apparatus 90.

Accordingly, it will be seen that this invention provides an external cavity laser apparatus with fast, highly predictable tuning of laser output wavelength which allows quick and easy wavelength-specific characterization of optical components. Although the description above contains many specificities, these should not be construed as limiting the scope of the invention but as merely providing an illustration of the presently preferred embodiment of the invention. Thus the scope of this invention should be determined by the appended claims and their legal equivalents.

What is claimed is:

1. A tunable laser apparatus, comprising:

a resonator cavity having first and second reflective elements positioned therein, at least one of said reflective elements being movable;

a gain medium positioned in said resonator cavity; and a cam body positioned in said resonator cavity to move said movable reflective element;

said cam body being shaped to provide a predetermined tuning speed.

2. The laser apparatus of claim 1, wherein an output wavelength of said laser apparatus varies linearly with respect to time.

3. The tunable laser apparatus of claim 1, wherein said tunable laser apparatus has a tuning speed in the range of between about 0.001 nanometers per second and about 40,000 nanometers per second.

4. The tunable laser apparatus of claim 1, wherein said tunable laser apparatus has a tuning speed in the range of between about 100 nanometers per second, and about 10,000 nanometers per second.

5. The tunable laser apparatus of claim 1, wherein said tunable laser apparatus has a tuning speed in the range of between about 100 nanometers per second and about 1,000 nanometers per second.

6. A laser apparatus, comprising:

a resonator cavity having first and second reflective elements, one of said reflective elements being movable;

a gain medium positioned in said resonator cavity;

a rotatable cam body positioned in said resonator cavity to move said movable reflective element;

a drive source rotatably coupled to said rotatable cam body;

said cam body being shaped to provide a predetermined tuning speed.

7. The laser apparatus of claim 6, wherein an output wavelength of said laser apparatus varies linearly with respect to time.

8. The laser apparatus of claim 6, wherein said laser apparatus has a tuning speed of greater than 100 nanometers per second.

9. A laser apparatus, comprising (a) a resonator cavity including a movable reflective element positioned therein;

(b) a cam body operatively coupled to said movable reflective element;

(c) a drive element rotatably coupled to said cam body; and (d) said cam body being shaped to provide a predetermined tuning speed.

10. The laser apparatus of claim 9, wherein said resonator cavity has a tuning rate of at least one hundred nanometers per second.

11. The laser apparatus of claim 9, further comprising a pivoting actuator arm, said movable reflective element coupled to said pivoting actuator arm.

12. The tunable laser apparatus of claim 11, wherein said pivoting actuator arm further comprises a low friction surface, said low friction surface positioned adjacent said cam body, said low friction surface configured to reduce friction between the cam and actuator arm to reduce the likelihood of vibration during movement of the cam and actuator arm.

13. The tunable laser apparatus of claim 9, said tunable laser having a change in output wavelength $\lambda$ with respect to cam rotation speed $\omega$ such that $d\lambda/d\omega$ is equal to a constant.

* * * * *